(12) United States Patent
Goldfinch (10) Patent No.: US 6,900,659 B2
(45) Date of Patent: May 31, 2005

(54) METHODS AND APPARATUS FOR LOADING DATA INTO A PLURALITY OF PROGRAMMABLE DEVICES

(75) Inventor: Jonathan Lasselet Goldfinch, High Peak (GB)

(73) Assignee: Anadigm Limited, Crewe (GB)

( * ) Notice: Subject to any disclaimer, the term of this patent is extended or adjusted under 35 U.S.C. 154(b) by 152 days.

(21) Appl. No.: 10/246,115

(22) Filed: Sep. 17, 2002

(65) Prior Publication Data

US 2003/0052710 A1 Mar. 20, 2003

(30) Foreign Application Priority Data

Sep. 18, 2001 (GB) .............................................. 0122479

(51) Int. Cl.$^7$ ......................................... H03K 19/177
(52) U.S. Cl. ............................ 326/41; 326/37; 716/16
(58) Field of Search .............................. 326/41, 37–39, 326/47; 716/16–17; 710/8, 10

(56) References Cited

U.S. PATENT DOCUMENTS

| | | | |
|---|---|---|---|
| 5,493,239 A | | 2/1996 | Zlotnick ....................... 326/38 |
| 5,524,243 A | * | 6/1996 | Gheorghiu ....................... 713/1 |
| 5,640,106 A | | 6/1997 | Erickson et al. .............. 326/38 |
| 5,654,650 A | * | 8/1997 | Gissel ........................... 326/38 |
| 5,696,454 A | | 12/1997 | Trimberger ................... 326/38 |
| 5,721,498 A | * | 2/1998 | Mason et al. .................. 326/38 |
| 5,737,235 A | * | 4/1998 | Kean et al. .................... 716/16 |
| 5,838,167 A | | 11/1998 | Erickson et al. .............. 326/38 |

* cited by examiner

Primary Examiner—James H. Cho
(74) Attorney, Agent, or Firm—Wells St. John P.S.

(57) ABSTRACT

There is disclosed a method for loading data into a plurality of programmable devices connected in parallel to one or more data lines comprising the steps of: enabling a first programmable device to receive data from the one or more data lines; loading data into the first programmable device; polling the first programmable device from a second programmable device while data are being loaded into the first programmable device, the polling being performed in order to recognize a condition indication in the first programmable device; having recognized the condition location, enabling the second programmable device to receive data from the one or more data lines; and loading data into the second programmable device.

24 Claims, 3 Drawing Sheets

Fig. 6

METHODS AND APPARATUS FOR LOADING DATA INTO A PLURALITY OF PROGRAMMABLE DEVICES

PRIORITY CLAIM

This patent claims priority from earlier filed United Kingdom Patent Application No. GB 0122479.9, filed Sep. 18, 2001, entitled "Methods and Apparatus for Loading Data Into a Plurality of Programmable Devices", by Jonathan Lasselet Goldfinch.

TECHNICAL FIELD

This invention relates to methods and apparatus for loading data into a plurality of programmable devices, with particular, but by no means exclusive, reference to the loading of data into a plurality of field programmable analog arrays.

BACKGROUND OF THE INVENTION

Figure 1:
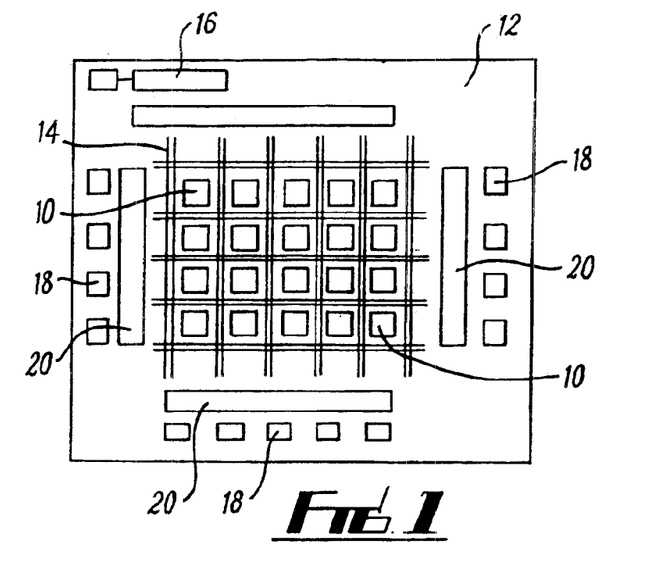
FIG. 1 is a schematic diagram of a single FPAA device.

Field programmable analog arrays (FPAAs) are a relatively recent development in the electronics industry which enable a user to quickly and flexibly design and implement an extremely wide range of analog circuits. FIG. 1 shows an example of an FPAA comprising an array of individual, configurable analog blocks (CABs) 10 on a silicon chip 12. The CABs may be based on switched capacitor circuit technology, using capacitors which are integrated on silicon. A CAB might comprise a switched capacitor CMOS op amp, a comparator, an array of capacitors, CMOS switches and SRAM. The CABs are interconnected with configurable connections 14. Configurable Op amps 18, configurable band gap voltage references and other configurable analog elements are also dispersed across the chip. Configurable I/O blocks 20 and other configurable elements are disposed on the periphery of the chip. Configuration of all the configurable elements on the chip is carried out using configuration logic 16. The configuration logic provides an interface to a configuration data source and implements a mechanism by which configuration data is loaded into configurable elements on the chip, thereby defining the functionality of the FPAA.

Thus, by inputting user controllable configuration data to the FPAA, the FPAA can be programmed to replicate the functions of a large number of analog components or circuits, for example rectifiers, sample and hold circuits, filters, and level detectors. However, it is not possible to replicate the function of all circuits using a single FPAA, due to the finite number of resources available on a single FPAA. In principle, it is possible to solve this problem by utilizing a plurality of FPPAs interconnected in a "daisy chain". In practice, the problems associated with conveniently loading data into such a daisy chain arrangement of FPAAs have been little explored. In one known arrangement (Zetex FAS TRAC), a plurality of FPAAs are 'daisy chained', each FPAA having a clock input pin, a data input pin and a data output pin. The data output of the first device is connected to the data input of the second device, the data output of the second device is connected to the data input of the third device, etc., and the clock pins are all connected together. To program the last device in the chain, data must be clocked through every register stage in each of the previous devices. In another known arrangement (LATTICE ISPPac), a plurality of field programmable analog devices are 'daisy chained' in a system in which each device is configured via a standard four pin JTAG interface. Following standard JTAG protocol, data to a particular device in a system must be clocked through a single register in each preceding device in a chain of JTAG devices.

A number of different methods are known for inputting data into various programmable logic devices such as field programmable gated arrays (FPGAs). Such devices differ structurally from FPAAs, since the latter are not logic devices. Nonetheless, the present inventors have recognized that certain programmable logic devices can comprise a number of unconfigured programmable units arranged in a daisy chain, which units are configured by loading data from a data stream.

One common method of transferring primary configuration data to programmable logic devices is to use a clocked serial EPROM to transfer data serially down into the programmable devices. Another method is to use a serial interface to an external device which is used to download serial configuration data. In both methods the problem to be solved is that of ensuring that a concatenated primary configuration bitstream is applied correctly to the programmable devices, with the correct section of the bitstream being supplied to the right device. If reconfiguration is supported, then once primary configuration is complete, the same interface must be used to support reconfiguration.

A number of methods have been developed for ensuring that the serial bitstream is supplied to the correct programmable device.

One method comprises providing a chip select pin to each device and to synchronize the assertion of the chip select pin with the arrival of the correct portion of the configuration bitstream. This method is, however, inefficient, as it requires that there be N chip select tracks routed through a system comprising N programmable devices. In addition, there is a software and hardware processing overhead introduced by the synchronizing mechanism.

A second method is to route the serial bitstream through each device in the chain. In this system data arrive on the first device in the chain on a DIN pin, and leaves via a DOUT pin, which is connected to the DIN pin of the second device in the chain. The connections continue in this manner over as many devices as there are in the chain. The system is arranged such that data are loaded serially into the first device which begins configuring. Until the device has configured, data are inhibited from passing through to DOUT and therefore the second device sees no data. Once the first device has configured, data on the DIN pin are effectively routed directly to the DOUT pin via a single register stage and the second device then inputs data via the DIN pin and begins to configure. Likewise the second device inhibits data from passing to its DOUT pin until configuration is complete. The method, however, has the disadvantage of being slow, since data being targeted at the last device in the chain must first be clocked through all preceding devices. Another approach to this problem is given in U.S. Pat. No. 5,696,454, where the problem of having to clock data through preceding devices is minimized by utilizing a 'local count' byte in the configuration bitstream, which, if set to zero, allows a device to be bypassed using a single register stage as before. In the case where only part of the device is to be configured a 'remainder count' byte is utilized which is used to determine the amount of configuration data to be loaded into a particular device before bypassing takes place. There will, however, still be a pipelining delay through a chain since each device must evaluate and process the 'local count' byte and 'remainder byte' (and associated data bytes) before bypassing takes place.

This pipelining disadvantage is a particular handicap if the methodology is used subsequently to try and selectively reconfigure particular devices in a chain, since data must first be routed through all preceding devices. A general approach when reconfiguration is required is to reconfigure all the devices in the chain including those that do not actually need updating.

In a third, token based, method, token based method data are applied in parallel to all of the programmble devices, and a token is passed from one device to the next in the chain as each one becomes programmed. The token enables the next device to start receiving configuration data. Loading of data is controlled by controlling the configuration clock.

U.S. Pat. No. 5,640,106 and U.S. Pat. No. 5,838,167 describe a further token based method in which two separate enable signals are used for configuration. One of the enables, EN2, is common between all devices in a system, and can be used to enable and disable the primary configuration process for all devices in the system. The other enable, EN1, is used to initiate configuration of a first device. Once configuration of the first device is complete, the first device asserts an output signal which is used to enable EN1 on a second device, which then starts to configure. This process carries on ad-infinitum with the enabling 'token' being passed to the next device in the chain once the previous device is configured. The clock in this system is not used directly to control the configuration process, and by implication is continuous.

SUMMARY OF THE INVENTION

The present invention addresses the above-mentioned disadvantages and problems, and provides an efficient, rapid and flexible approach to the ordered primary configuration of arrays of individual FPAA units. Furthermore, the present invention provides an efficient, rapid and flexible approach to reconfiguration and other data loading processes relating to arrays of individual FPAA units. Further still, although the present invention is primarily addressed to the technical field of FPAA devices, the present inventors have recognized that the methodologies can be applied more widely, to the loading of data into arrays of programmable devices per se.

According to a first aspect of the invention there is provided a method for loading data into a plurality of programmable devices connected in parallel to one or more data lines, comprising the steps of:
- enabling a first programmable device to receive data from the one or more data lines;
- loading data into the first programmable device;
- polling the first programmable device from a second programmable device while data are being loaded into the first programmable device, the polling being performed in order to recognize a condition indication in the first programmable device;
- having recognized the condition indication, enabling the second programmable device to receive data from the one or more data lines; and
- loading data into the second programmable device.

The method is efficient, flexible, rapid and allows some highly unusual configuration architectures to be implemented easily. The method is in contrast to the above-described token based prior art methods in which a device is enabled by a signal from a preceding device once the loading of data into the preceding device is complete. With the present invention, instead of passively waiting for an enable command, a device actively polls the preceding device. A single data line might be utilized, or multiple data lines, i.e., a data bus, might be employed.

The step of polling the first programmale device may comprise polling a passive pin on the first programmable device, which pin is connected to a node, which node is passively and selectably connected to an active pull-up or active pull-down. The condition indication may be a logic state detectable on the passive pin.

The step of polling the first programmable device may comprise driving, tristating and registering the state on a bi-directional pin on the second programmable device, which bi-directional pin is connected to the first programmable device so as to be affected by the occurrence of the condition indication. The step of polling the first programmable device may comprise driving out of the bi-directional pin during a first time period and tristating said bi-directional pin during a second time period.

Each of the plurality of programmable devices may be connected in parallel to a common enable line. An advantage with this approach is that the plurality of programmable devices can be addressed as a peripheral, and while not being addressed interface signals, e.g., data out and clock signals, can be used to drive other selected devices or systems.

The condition indication may be generated by the first programmable device before the step of loading data into the first programmable device is completed. This enhances the efficiency of the data transfer by allowing a subsequent programmable device advance notice of programming data arrival.

The programmable devices may be connected to a clock, and the method may further comprise the step of controlling the loading of data into the programmable devices by operating the clock in a non-continuous manner.

The data may comprise configuration data. Other information bytes, such as address bytes, JTAG ID bytes, device ID bytes, error check bytes, and "number of data bytes" bytes, will typically be present as well.

The data may comprise reconfiguration data.

The plurality of programmable devices may comprise FPAA devices.

According to a second aspect of the invention, there is provided a method for loading data into a plurality of programmable systems, each programmable system comprising a plurality of programmable devices, in which data is loaded into each programmable system using a method according to the first aspect of the invention, and in which the systems are connected to a common data line.

The systems may be connected to a common enable line.

According to a third aspect of the invention there is provided apparatus for loading data into a plurality of programmable devices comprising at least a first and a second programmable device, in which the apparatus comprises:
- one or more data lines connected to each of the programmable devices in parallel; and
- means for enabling the first programmable device to receive data from the one or more data lines;

in which:
- the first programmable device comprises means for providing a condition indication; and
- the second programmable device comprises: polling means for polling the first programmable device while data are being loaded into said first programmable device in order to recognize the condition indication; and means for enabling the second programmable device to receive data from the one or more data lines.

The means for providing a condition indicator may comprise a passive pin. The condition indication may be a logic state detectable on the passively driven pin.

The apparatus may further comprise a node connected to said passive pin, an active pull-up and an active pull-down, the active pull-up and active pull-down both being selectably connectable to the passive pin so as to alter the logic level detectable on said passive pin.

The polling means may comprise a bi-directional pin on the second programmable device, which pin is connected to the first programmable device so as to be affected by the occurrence of the condition indication.

The apparatus may further comprise a common enable line connected in parallel to each of the plurality of programmable devices.

The means for providing a condition indicator may comprise means for analyzing an incoming datastream, and means operable to provide the condition indicator at a point in time based on analysis of the incoming datastream and before loading of data into the first programmable device has been completed.

The apparatus may further comprise a clock connected to the programmable devices and operable in a non-continuous manner thereby to control the loading of data into the programmable devices.

The plurality of programmable devices may comprise FPAA devices.

According to a fourth aspect of the invention there is provided a method for loading data into a plurality of programmable devices connected in parallel to one or more data lines comprising the steps of:
  enabling a first programmable device to receive data from the one or more data lines;
  loading data into the first programmable device;
  enabling a second programmable device to receive data from the one or more data lines before the loading of data into the first programmable device is complete; and
  loading data into the second programmable device.

In this way, "early warning" is given to a subsequent device that data transfer to the previous device is nearly complete. This enhances the efficiency of the data transfer by allowing a subsequent programmable device advance notice of programming data arrival. The method of the first aspect of the invention may be utilized; i.e., a condition indication may be generated by the first programmable device before the step of loading data into the first programmable device is completed. Alternatively, a token based system might be employed. Such systems are disclosed, for example in U.S. Pat. No. 5,640,106 and U.S. Pat. No. 5,838,167, the contents of which are hereby incorporated by reference, and may be adopted to permit early transfer of the token before the loading of data onto a device is completed.

According to a fifth aspect of the invention there is provided apparatus for loading data into a plurality of programmable devices comprising at least a first and a second programmable device, in which the apparatus comprises:
  one or more data lines connected to each of the programmable devices in parallel;
  means for enabling the first programmable device to receive data from the one or more data lines;
  means for loading data into the first programmable device from said one or more data lines;
  means for enabling the second programmable device to receive data from the one or more data lines;
  in which the means for enabling the second programmable device enables said second programmable device before the loading of data into the first programmable device is complete.

BRIEF DESCRIPTION OF THE DRAWINGS

Embodiments of methods and apparatus in accordance with the invention will now be described with reference to the accompanying drawings, in which.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 2:
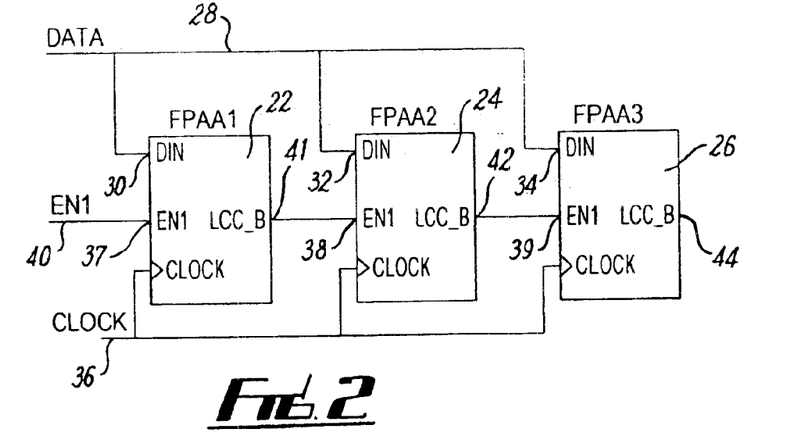
FIG. 2 shows a first embodiment of an apparatus according to the invention comprising a plurality of FPAA devices.

FIG. 2 shows a block diagram of a first embodiment of the invention. An arrangement of FPAA devices 22, 24, 26 are connected in parallel to a data line (or bus) 28 via DIN (data in pins) 30, 32, 34. It will be apparent to the skilled reader that more, or fewer devices might be connected in the arrangement. Additionally, the FPAA devices 22, 24, 26 are connected in parallel to a configuration clock line (CLOCK) 36. The first FPAA device 22 has an enable pin (henceforth termed "CS_B1 pin") 37 which is connected to an ENABLE line 40. The data, clock and first device enable functions are provided by a control arrangement (not shown), which might be an interface connected to a host device such as a personal computer. The clock function could alternatively be sourced from one of the FPAAs.

The FPAA devices 22,24,26 each comprise a passive pin 41,42,44, hereinafter referred to as an LCC_B pin. The second FPAA device 24 has a CS_B1 enable pin 38 in connection with the LCC_B pin 41 of the first FPAA device 22. The third FPAA device 26 has a CS_B1 enable pin 39 in connection with the LCC_B pin 42 of the second FPAA device 24. Thus, the FPAA devices 22, 24, 26 are connected as a daisy-chain for the purpose of enabling each device to accept data from the data line 28.

In use, the devices undergo a power-up routine and, after a predetermined time, the devices begin to accept configuration data.

Figure 3:
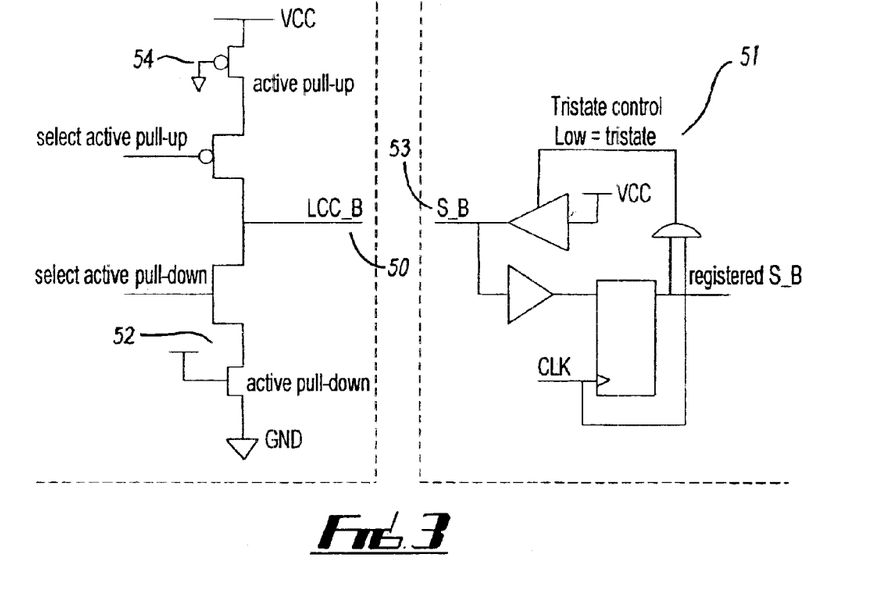
FIG. 3 shows a condition indication and polling arrangement.

In the arrangement of FIG. 2, at power on, all LCC_B signals are arranged to be high. At the end of the power-up routine, the CS_B1 pins 37, 38, 39 are sampled once, and the logic value on the pin is used to determine how the pin will function. If the pin is low when sampled, then the pin acts as a simple active low enable input, and configuration data is loaded in on the rising edge of the CLOCK. If the pin is high when sampled, CS_B1 is continuously driven high as an output by the device on the positive edge of the clock, tristated on the negative edge, and then the resulting value on the CS_B1 pin is registered internally on the next clock cycle. Note that if the LCC_B pin was a normal driving output pin, then the action of CS_B1 and LCC_B driving together at different logic levels would result in device damage and failure. For this reason, LCC_B does not drive directly during primary configuration, but, rather, is a passive pin. FIG. 3 shows an internal arrangement of a passive pin 50 on an FPAA device in a multi-device arrangement, and also depicts polling means 51 which are disposed on the following FPAA device in the multi-device arrangement and connected to the CS_B1 pin 53.

On power up, the LCC_B pin 50 is internally connected to the weak active pull-up 54. Once the first device is configured LCC_B 50 is instead connected to the active pull-down 52. After power-up, for all devices in a chain apart from the first, the CS_B1 pin 53 will be constantly polling by driving high, tristating and registering.

For those skilled in the art, it will be apparent that while the active pull-up 54 is selected on LCC_B 50, CS_B1 53 of the following device will always see a logic HIGH when the CS_B1 input is registered. However as soon as configuration of the preceding device has finished and the active pull-down is selected on LCC_B, the CS_B1 input of the following device will pull low during the tristate period and will be registered as a logic LOW.

Also, it will be apparent to those skilled in the art that many other internal arrangements are possible which would still enable active polling of a device by a following device in the daisy-chain arrangement.

Figure 4:
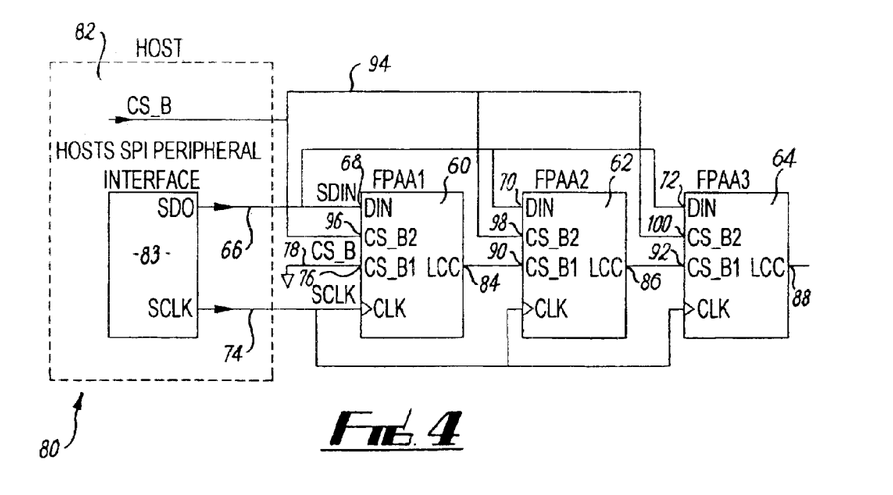
FIG. 4 shows a second embodiment of an apparatus according to the invention comprising a plurality of FPAA devices.

FIG. 4 depicts a second embodiment, again comprising, in this non-limiting example, a daisy-chain of three FPAA devices 60, 62, 64 which are connected in parallel to a data line 66 via DIN pins 68, 70, 72. Additionally, the FPAA devices 60, 62, 64 are connected in parallel to a configuration clock line (SCLK) 74. In common with the first embodiment, the first FPAA device 60 has a CS_B1 enable pin 76 which is connected to an ENABLE line 78. The data, clock and first device enable functions are provided by a control arrangement 80, which comprises a host microprocessor 82 with an SPI interface 83 outputting SDO and SCLK signals. As noted earlier, other suitable forms of control arrangements might instead be used. The FPAA devices 60, 62, 64 each comprise a passively driven output pin (LCC_B pin) 84, 86, 88. The second FPAA device 62 and third FPAA device 64 each possess a CS_B1 enable pin 90, 92 which is connected to the LCC_B pin of the previous FPAA device in the daisy-chain. In common with the first embodiment, the loading of data into the first FPAA device 60 is initiated at the end of power-up when a logic low is sampled on the CS_B1 pin 38.

Loading of data into the second FPAA device 62 is initiatd by the detection of a condition indication on the LCC_B pin 84 of the first FPAA device 60. Likewise, the loading of data into the third FPAA device is initiated by the detection of a condition indication on the LCC_B1 pin 86 of the second FPAA device 62. The detection of a condition indication is accomplished by polling the previous device in the daisy-chain using polling means which are not shown in FIG. 4, but which can comprise substantially the arrangement shown in FIG. 3. The generation of the condition indication on the LCC_B pins 84, 86, 88 can be accomplished using substantially the arrangement shown in FIG. 3.

The second embodiment further comprises a common enable line 94 which is connected in parallel to each FPAA device 60, 62, 64 via global enable pins (henceforth referred to as CS_B2 pins) 96, 98, 100.

The global enable pin CS_B2 can be used to control whether data is clocked into a device or not during primary configuration and subsequently during reconfiguration. The CS_B2 pin only becomes functional once the CS_B1 pin on a device has been taken low. During primary configuration of the arrangement depicted in FIG. 4, CS_B1 pin 76 on the first FPAA device 60 is low, which has the consequence that the common enable line 94 operates as a global enable for the first FPAA device 60 only. The first FPAA device 60 can therefore be selected for configuration by the host microprocessor 82, and data can be clocked in using the clock while CS_B2 pin 96 is high. Because the first FPAA 60 device has not configured, the LCC_B pin 84 stays high and so the second FPAA device 62 sees a logic high on the CS_B1 pin 90. The second FPAA devices 62 responds to this condition by disabling the CS_B2 pin 98 so that any changes on it during primary configuration are ignored. Only when the first FPAA device 60 has configured and its LCC_B pin 84 taken low does the second FPAA device 62 use the CS_B2 98 pin to control whether data should be clocked in. This means that, during configuration, an FPAA system comprising a number of devices can be addressed as a peripheral, and while not being addressed the SPI signals SDO and SCLK can be used to drive other selected devices or systems. Devices that have not undergone primary configuration simply ignore the state of the CS_B2 pin.

A dual enable line technique is disclosed in U.S. Pat. No. 5,640,106 and U.S. Pat. No. 5,838,167. However, in contrast to this prior art technique, the use of CS_B2 in the present implementation also advantageously allows control over the reconfiguration process. During reconfiguration, the CS_B2 pin is monitored by each device, and, while low, reconfiguration data are inhibited from being clocked in. While high, the same data are clocked into each device, but only those selected by an ID field in the datastream will process the data.

It is advantageous to utilize dedicated configuration clock pins in connection with the present invention. Such clock pins can be configured as aperiodic configuration control inputs, rather than as the fixed periodic configuration clock as implied in U.S. Pat. No. 5,640,106 and U.S. Pat. No. 5,838,167. This approach permits further flexibility in the operation of the apparatus, and allows devices to be easily interfaced to hosts which generate non-continuous configuration clocks, such as an SPI interface. Thus, in the embodiment shown in FIG. 4, SCLK is not continuous. The clocking in of configuration data onto the device is controlled by pulsing SCLK. If SCLK halts at any time, then no more data are clocked in until SCLK restarts.

An extremely advantageous facet of the polling technique described herein is that it is possible to generate the enable signal for the next device in a chain early, before the first device has completed primary configuration. This is possible because of the nature of the bitstream interpretation state machine in each FPAA. In operation, when a first device is about to load the error checking or CRC bytes associated with the last block of configuration data for the first device, a "prewarn" signal is generated which enables a second device and tells the second device to look for a synch byte in the bitstream (it is necessary that the error checking or CRC bytes for the first device do not include the synch byte). The method provides the second device with 8 to 16 clock cycles advance warning that it is to be configured. The prewarn signal could be generated even earlier if the synch byte can be guaranteed not to occur within the remaining bitstream to the device. Checks for this could easily be done by the software used to generate the primary configuration bitstream.

By allowing a second device in a chain advance notice that the first device is about to complete configuration, additional notice time is provided which can be used to advantage. It becomes possible, for example, to implement ultra low power shutdown procedures, with a phased wake up sequence in the second device initiated and completed during the advance notice time. It is also possible to use the time to load device variables via the normal device pins, with the device pins being reconfigured during this advance time period to perform other tasks. At the end of the time period the pins could be set back to normal operation. Further possibilities include using the time to invoke a simple handshaking statemachine to load up configuration options via a single pin rather than utilizing multiple pins. Another possibility might be to poll the state on a line common to all devices. The polled state could then be used to determine, for example, if the device should be configured, allowing configuration of that particular device to be missed out if configuration is not required. Thus, in a multi-device system, it becomes feasible to configure a small subset of the devices quickly, using a much smaller length bitstream than that required to reconfigure all devices.

Figure 5:
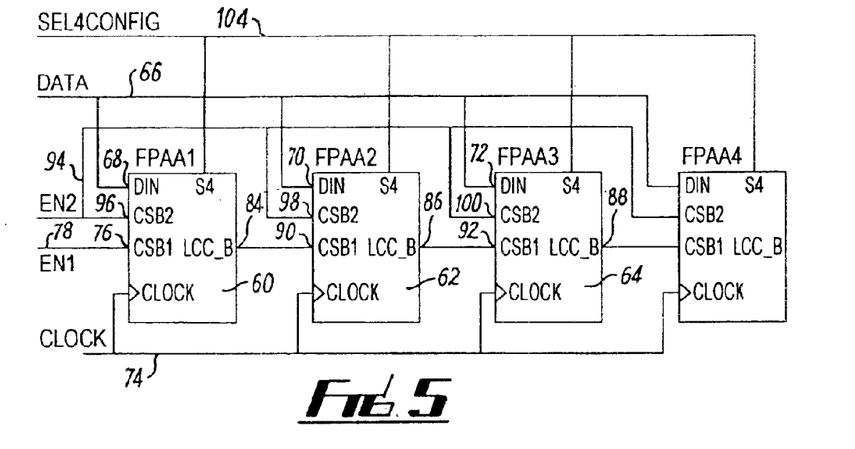
FIG. 5 shows an arrangement for early enablement of an FPAA device.

FIG. 5 depicts an arrangement by which such possible applications might be implemented. The arrangement shares many common features with the arrangement of FIG. 4, and thus identical numerals to FIG. 4 have been used to denote such shared features. The arrangement further comprises a line SEL4CONFIG 104 common to all devices, would be sychronized to the early generation of the LCC_B signal. If asserted when LCC_B is generated early, configuration of the next device would be skipped, with an early LCC_B signal being generated in an ordered fashion.

Figure 6:
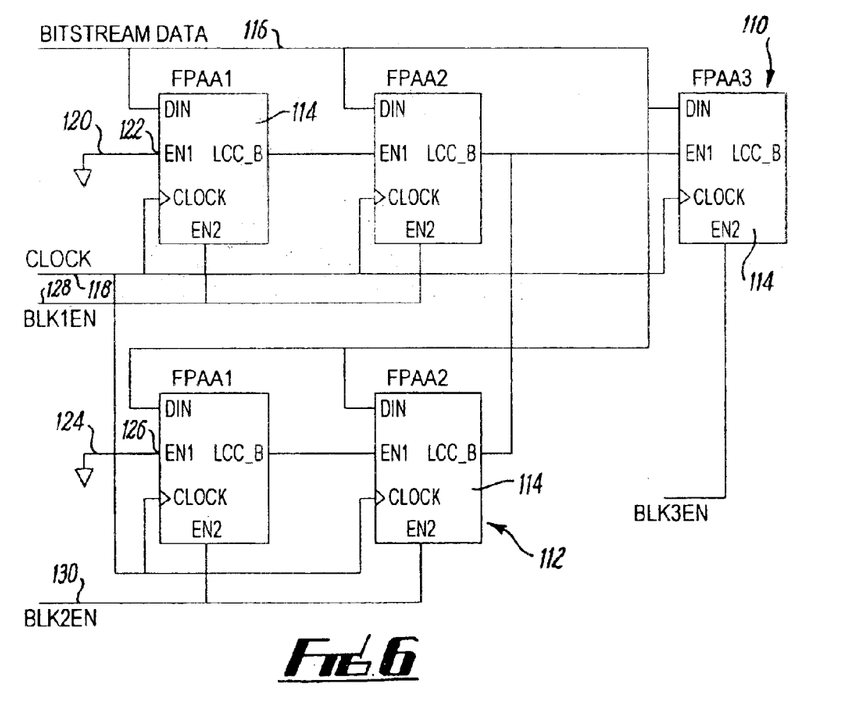
FIG. 6 shows a multi-chip arrangement comprising two apparatus having pluralities of FPAA devices.

The polling method of the present invention permits the easy and convenient implementation of some highly unusual configuration architectures. FIG. 6 illustrates one such configuration architecture comprising a multi-chip system in which two separate, physically distinct arrangements 110, 112 of pluralities of FPAA devices 114 are controlled by a common control arrangement (not shown) in which a common dataline or databus 116 is connected to, and thereby feeds bitstream data to, the two arrangements 110, 1112. The control arrangement also provides a common clock line 118 to the two arrangements 110, 112 of FPAA devices 114. Each arrangement is interconnected in accordance with the principles set forth in respect of the second embodiment. Thus, the control arrangement further provides an ENABLE line 120 connected to an enable pin 122 of a first FPAA device in the first arrangement 100, and an ENABLE line 124 connected to an enable pin 126 of a first FPAA device in the second arrangement 112. Additionally, the control arrangement provides a common enable line 128 connected to each FPAA device in the first arrangement 110, and a common enable line 130 connected to each FPAA device in the second arrangement 112. Individual FPAA devices have passive output pins, enable pins and polling means as previously described with reference to FIGS. 3 and 4.

Noting that the LCC_B pins of the last FPAA in each arrangement 110, 112 are connected together, something that is not possible using existing token transfer methodologies without additional hardware, and which only becomes possible because of the polling mechanism employed, it can be seen that by controlling the common enable lines 128, 130, it is possible to selectively configure the two entirely separate arrangements 110, 112 of FPAA devices using a common bitstream generator. Outputs on an unconfigured device are always high impedance, and thus it is possible for the two arrangements 110, 112 to physically interconnect to the same external hardware without difficulty.

The skilled reader will appreciate that the above scheme could easily be adapted for use in fault tolerant redundancy networks and other purposes.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method for loading data into a plurality of programmable devices connected in parallel to one or more data lines comprising the steps of:
   enabling a first programmable device to receive data from the one or more data lines;
   loading data into the first programmable device;
   polling the first programmable device from a second programmable device while data are being loaded into the first programmable device, the polling being performed in order to recognize a condition indication in the first programmable device;
   having recognized the condition indication, enabling the second programmable device to receive data from the one or more data lines; and
   loading data into the second programmable device.

2. A method according to claim 1 in which the step of polling the first programmable device comprises polling a passive pin on the first programmable device, which pin is connected to a node, which node is passively and selectably connected to an active pull-up or active pull-down.

3. A method according to claim 2 in which the condition indication is a logic state detectable on the passive pin.

4. A method according to claim 1 in which the step of polling the first programmable device comprises driving, tristating and registering the state on a bi-directional pin on the second programmable device, which bi-directional pin is connected to the first programmable device so as to be affected by the occurrence of the condition indication.

5. A method according to claim 4 in which the step of polling the first programmable device comprises driving out of the bi-directional pin during a first time period, and tristating said bi-directional pin during a second time period.

6. A method according to claim 1 in which each of the plurality of programmable devices is connected in parallel to a common enable line.

7. A method according to claim 1 in which the condition indication is generated by the first programmable device before the step of loading data into the first programmable device is completed.

8. A method according to claim 1 in which the programmable devices are connected to a clock, and further comprising the step of controlling the loading of data into the programmable devices by operating the clock in a non-continuous manner.

9. A method according to claim 1 in which the data comprises configuration data.

10. A method according to claim 1 in which the data comprises reconfiguration data.

11. A method according to claim 1 in which the plurality of programmable devices comprise FPAA devices.

12. A method for loading data into a plurality of programmable systems, each programmable system comprising a plurality of programmable devices, in which data is loaded into each programmable system using a method according to claim 1, and in which the systems are connected to a common data line.

13. A method according to claim 12 in which the systems are connected to a common enable line.

14. Apparatus for loading data into a plurality of programmable devices comprising at least a first and a second programmable device, in which the apparatus comprises:
one or more data lines connected to each of the programmable devices in parallel; and
means for enabling the first programmable device to receive data from the one or more data lines;
in which:
the first programmable device comprises means for providing a condition indication; and
the second programmable device comprises: polling means for polling the first programmable device while data are being loaded into said first programmable device in order to recognize the condition indication; and means for enabling the second programmable device to receive data from the one or more data lines.

15. Apparatus according to claim 14 in which the means for providing a condition indicator comprises a passive pin.

16. Apparatus according to claim 15 in which the condition indication is a logic state detectable on the passive pin.

17. Apparatus according to claim 16 further comprising a node connected to said passive pin, an active pull-up and an active pull-down, the active pull-up and active pull-down both being selectably connectable to the passive pin so as to alter the logic state detectable on said passive pin.

18. Apparatus according to claim 14 in which the polling means comprises a bi-directional pin on the second programmable device, which pin is connected to the first programmable device so as to be affected by the occurrence of the condition indication, and means for driving, tristating and registering the state on said bi-directional pin.

19. Apparatus according to claim 14 further comprising a common enable line connected in parallel to each of the plurality of programmable devices.

20. Apparatus according to claim 14 in which the means for providing a condition indication comprises means for analyzing an incoming datastream, and means operable to provide the condition indication at a point in time based on analysis of the incoming datastream and before loading of data into the first programmable device has been completed.

21. Apparatus according to claim 14 further comprising a clock connected to the programmable devices and operable in a non-continuous manner thereby to control the loading of data into the programmable devices.

22. Apparatus according to claim 14 in which the plurality of programmable devices comprise FPAA devices.

23. A method for loading data into a plurality of programmable devices connected in parallel to one or more data lines comprising the steps of:
enabling a first programmable device to receive data from the one or more data lines;
loading data into the first programmable device;
enabling a second programmable device to receive data from the one or more data lines before the loading of data into the first programmable device is complete by polling the first programmable device from the second programmable device while data are being loaded into the first programmable device, the polling being performed in order to recognize a condition indication in the first programmable device; and
having recognized the condition indication, enabling the second programmable device to receive data from the one or more data lines; and
loading data into the second programmable device.

24. Apparatus for loading data into a plurality of programmable devices comprising at least a first and a second programmable device, in which the apparatus comprises:
one or more data lines connected to each of the programmable devices in parallel;
means for enabling the first programmable device to receive data from the one or more data lines;
means for loading data into the first programmable device from said one or more data lines;
means for enabling the second programmable device to receive data from the one or more data lines including means for polling the first programmable device from the second programmable device while data are being loaded into the first programmable device, the polling being performed in order to recognize a condition indication in the first programmable device;
in which the means for enabling the second programmable device enables said second programmable device before the loading of data into the first programmable device is complete and having recognized the condition indication, the second programmable device is configured to receive data from the one or more data lines.

* * * * *

UNITED STATES PATENT AND TRADEMARK OFFICE
CERTIFICATE OF CORRECTION

PATENT NO. : 6,900,659 B2
DATED : May 31, 2005
INVENTOR(S) : Jonathan Lasselet Goldfinch It is certified that error appears in the above-identified patent and that said Letters Patent is hereby corrected as shown below:

Column 4,
Line 1, delete "programmale", and insert -- programmable --.

Column 7,
Line 46, delete "initiatd", and insert -- initiated --.

Column 9,
Line 37, delete "arrangements 110, 1112", and insert -- arrangements 110, 112 --.

Signed and Sealed this

Thirteenth Day of September, 2005

JON W. DUDAS
*Director of the United States Patent and Trademark Office*